(12) United States Patent
Ausserlechner

(10) Patent No.: US 9,671,433 B2
(45) Date of Patent: Jun. 6, 2017

(54) CURRENT SENSOR DEVICES AND METHODS

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 268 days.

(21) Appl. No.: 14/261,975

(22) Filed: Apr. 25, 2014

(65) Prior Publication Data

US 2015/0309078 A1    Oct. 29, 2015

(51) Int. Cl.
| | |
|---|---|
| *G01R 15/18* | (2006.01) |
| *G01R 19/00* | (2006.01) |
| *G01R 1/20* | (2006.01) |
| *G01R 15/20* | (2006.01) |
| G01R 35/00 | (2006.01) |
| H01L 23/495 | (2006.01) |

(52) U.S. Cl.
CPC .............. *G01R 15/18* (2013.01); *G01R 1/203* (2013.01); *G01R 15/207* (2013.01); *G01R 19/0092* (2013.01); *G01R 35/005* (2013.01); *H01L 23/49541* (2013.01); *H01L 2924/0002* (2013.01)

(58) Field of Classification Search
CPC .... G01R 19/0092; G01R 15/18; G01R 1/203; G01R 15/207; G01R 35/005
See application file for complete search history.

(56) References Cited

U.S. PATENT DOCUMENTS

| | | | | |
|---|---|---|---|---|
| 7,394,982 B2* | 7/2008 | Kern | .................... | G01R 15/248 398/108 |
| 7,439,726 B2* | 10/2008 | Luo | ......................... | G01R 1/22 324/117 R |
| 7,659,710 B2* | 2/2010 | Luo | ......................... | G01R 1/22 324/117 R |
| 8,125,239 B2* | 2/2012 | Rittmann | .............. | G01R 35/005 324/765.01 |
| 8,160,829 B2* | 4/2012 | Kalenine | ................. | G01R 15/09 307/35 |
| 2009/0039870 A1* | 2/2009 | Luo | ......................... | G01R 1/22 324/127 |
| 2009/0284250 A1* | 11/2009 | Rittmann | .............. | G01R 35/005 324/130 |
| 2009/0312970 A1* | 12/2009 | Kalenine | ................. | G01R 15/09 702/64 |
| 2012/0001617 A1* | 1/2012 | Reynolds | ................ | G01R 15/18 324/74 |

FOREIGN PATENT DOCUMENTS

| | | |
|---|---|---|
| DE | 103 33 089 A1 | 3/2005 |
| DE | 10 2013 100 156 A1 | 7/2013 |

* cited by examiner

*Primary Examiner* — Jermele M Hollington
*Assistant Examiner* — Christopher McAndrew
(74) *Attorney, Agent, or Firm* — Schiff Hardin LLP

(57) ABSTRACT

Devices and methods associated with current measurements are provided. A current in a conductor portion may be measured by a current sensing element. An output signal indicative of the current may be generated based on the measured current and information regarding a current path.

17 Claims, 4 Drawing Sheets

CURRENT SENSOR DEVICES AND METHODS

TECHNICAL FIELD

The present application relates to current sensor devices and to corresponding methods.

BACKGROUND

Current sensors are used in various applications to measure an electric current flowing through a conductor, for example a metal conductor or other type of conductor. Various types of current sensors are commonly employed in various applications. A first type of current sensor comprises magnetic current sensors, which measure a magnetic field generated by an electric current. Such a measurement does not need a galvanic coupling of a sensor circuit and the measured current. Magnetic current sensors may be coreless magnetic current sensors, where a magnetic flux generated by the current is not guided by permeable magnetic parts such as a soft magnetic transformer core, or magnetic current sensors with a core, where the current flows through a conductor which is enclosed by a magnetic core with a high permeability.

A second type of current sensors comprises shunt current sensors, where a voltage drop across a portion of a conductor, for example a portion with a defined resistance, is measured when current flows through it. Such a measurement often requires a galvanic coupling of sensor circuit and measured current.

With both of the aboves types, a conductor portion where the current is measured may be integrated with the sensor or external to the sensor (for example a wire passing through a ring core).

Current sensors, in particular conductor portions thereof through which the current to be measured flows, have been increasingly miniaturized in recent years. For example, a miniaturization of the conductor portion along a direction of current flow in some cases may serve to reduce power dissipation and generation of heat by the dissipated power. However, such a miniaturization may lead to inaccuracies or measurement errors, as a geometry of the surroundings of the current sensor and in particular a contact geometry may affect the measurement to a greater extent than for larger current sensors. This in particular applies to current sensors where the conductor is integrated with the current sensor.

DETAILED DESCRIPTION

Figure 1:
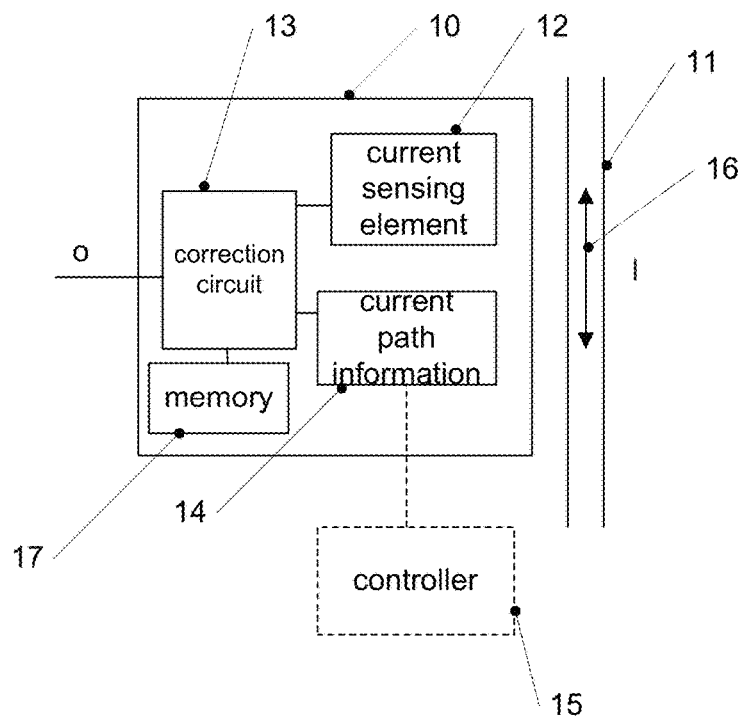
FIG. 1 is a block diagram illustrating a current sensor device according to an embodiment.

In the following, various embodiments will be described in detail with reference to the attached drawings. It is to be noted that these embodiments serve illustrative purposes only and are not to be construed as limiting. For example, while embodiments are described comprising a plurality of different details, features or elements, in other embodiments some of these details, features or elements may be omitted, may be implemented in a different manner than shown, and/or may be replaced by alternative details, features or elements. Additionally or alternatively, in other embodiments additional details, features or elements not explicitly described herein may be present. Connections or couplings, for example electrical connections or couplings shown in the drawings or described herein may be direct connections or indirect connections, indirect connections being connections with one or more additional intervening elements, as long as the general function of the respective coupling or connection, for example to transmit a certain kind of information in form of a signal, is maintained. Furthermore, connections or couplings may be implemented as wire-based connections or wireless connections unless specifically noted otherwise.

Furthermore, details, features or elements from different embodiments described herein or shown in the drawings may be combined to form further embodiments unless specifically noted otherwise.

In some embodiments, a current sensor device is provided. The current sensor device may comprise a current sensing element to sense a current through a conductor portion, for example a magnetic current sensing element or a shunt-based current sensing element. Furthermore, the current sensor device is adapted to obtain information regarding a current path the current takes, e.g. a path outside a conductor portion where the current is sensed, for example information indicative of a direction of the current. "Outside" the conductor portion may refer to one or more further conductor portions outside a housing including the conductor portion and the current sensing element, may refer to one or more further conductor portions having a greater diameter than the conductor portion, may refer to one or more further conductor portions having a greater distance from the current sensing element than the conductor portion, and/or may refer to one or more further conductor portions outside contact points like solder spots delimiting the conductor portion. In some embodiments, the conductor portion may be made of one piece, for example a structured metal piece. An output signal of the current sensor device is generated based on a measurement of the current sensing element and on the current path information. For example, the current path information may determine a calibration factor or other calibration or correction parameter applied to a measurement output of the current sensing element.

In some embodiments, the current path information may for example comprise a direction of a current flow. The current path information may be received from an external element like a controller, or may be obtained within the current sensor device, for example based on a preliminary current measurement.

In other embodiments, other features may be provided. In still other embodiments, corresponding methods may be provided.

Turning now to the Figures, in FIG. 1 a schematic block diagram illustrating a current sensor device 10 according to an embodiment is illustrated. While current sensor device 10 is depicted as comprising four separate blocks, this is merely for illustrating various functions performed within current sensor device 10 and is not to be construed as indicating that the separate blocks have to be implemented as physically separate portions or devices, but merely indicates that the respective functionalities are provided in the embodiment of FIG. 1. Generally, the functionalities described with respect to current sensor device 10 may be implemented in hardware, software, firmware or combinations thereof, to give some examples.

Current sensor device 10 comprises a current sensing element 12 adapted to sense a current I flowing in a conductor portion 11. Current sensing element 12 may for example comprise a magnetic sensor element like a Hall sensor element or a magnetoresistive element, for example a magnetoresistive element based on a giant magnetoresistance (GMR) effect or a tunneling magnetoresistance (TMR) effect. In other embodiments, current sensing element 12 may be a shunt-based current sensing element measuring a voltage drop over conductor 11 or part thereof, for example a part with a defined resistance. Moreover, as indicated by 14 current sensor device 10 receives a current path information, i.e. an information regarding a way the current to be measured is flowing.

For example, the current path information may comprise information regarding the direction of current flow, as indicated by an arrow 16 in FIG. 1. In other embodiments, the current path information may comprise an estimated or roughly measured magnitude of the current. In yet other embodiments, additionally or alternatively the current path information may comprise information regarding a direction from which the current enters conductor portion 11 and/or in which the current leaves conductor portion 11. Other kinds of current path information may also be provided.

The current path information in some embodiments may be obtained by current sensor device 10 internally. For example, prior to performing actual measurements, a preliminary measurement of the current may be performed by current sensing element 12. Based on this preliminary measurement, for example a direction (also referred to as polarity) of current I may be obtained. Furthermore, an approximation of the magnitude of current I may be obtained by the preliminary measurement in some embodiments. In other embodiments, additionally or alternatively current path information 14 may be obtained by an external source, for example a controller 15. Controller 15 may for example control switches directing current paths through conductor portion 11. A state of such switches may for example determine a direction of the current flow. In such a case, corresponding information may be provided by controller 15 to current sensor device 10.

In the embodiment of FIG. 1, an correction circuit 13 then generates an output signal o indicative of the magnitude of current I based on a measurement output of current sensing element 12 and on the current path information. For example, in some embodiments depending on the current path information different calibration factors may be applied to a measurement signal from current sensing element 12 to form output signal o. In other embodiments, for example based on the current path information different bias voltages or bias currents may be applied to current sensing element 12 to take the current path information into account. In other embodiments, instead of a calibration factor, which may be close to 1, a correction value which may be small compared with the current to be measured may be added to or subtracted from the measurement signal from current sensing element 12. Such a correction or calibration may be implemented in different ways, for example by analog electronic means, by time continuous or time discrete techniques like switched capacitors or by digital techniques or combinations thereof. In some embodiments, a lookup table stored e.g. in current sensor device 10, e.g. in a memory 17 thereof, may be used, where for example depending on a polarity of the current I and possibly also on an approximate magnitude of the current to be measured a calibration value is read out of a stored table.

It should be noted that conductor portion 11 or part thereof where current sensing element 12 measures the current may be part of the current sensor device 10 itself in some embodiments, and the representation in FIG. 1 where conductor portion 11 is on a side of current sensor device 10 is only for ease of representation.

As mentioned above, in some embodiments the current path information may also comprise information regarding a magnitude of the current. In some embodiments, such an estimate or approximate measurement of the magnitude may indicate a current path. For example, in some embodiments a small current may be delivered only via a single transistor acting for example as a switch, whereas large currents may be delivered by a parallel connection of several transistors. In embodiments, such transistors may have a non-negligible size and may be positioned side by side for example on a cooling plate like a direct copper bond board. In such a case for example small currents may be carried by a transistor which is close to current sensing element 12, whereas at larger current portions of that currents are also carried by more distant transistors. In such a case, correction circuit 13 of current sensor device 10 may for example multiply a smaller current by a larger factor, for example 1.03, whereas larger currents in the same direction may be multiplied by a smaller factor, for example 1.01. These values and relations serve only explanatory purposes and my be different in other embodiments. In practice they may depend on an arrangement and size of elements of the respective embodiment (such as conductor traces and power transistors used to carry the current) as well as on their physical properties (e.g. their on-resistance) and/or also on a thermal and transient behavior of the embodiment. The values and relations can for example be determined experimentally.

Generally, such embodiments use that in particular for small current sensor devices and/or small current sensing elements the current sensed may depend on the current path, for example due to inhomogeneous field distributions at the current sensing element. The influence of the current path is difficult to calibrate in advance. For example, as explained current sensing element 12 measures the current flowing through conductor portion 16. Conventionally, during or at an end of manufacturing device 10 device 10 is calibrated by means of conductor portion 11 or a test conductor simulation conductor portion 11. In devices where conductor portion 11 is part of device 10 and is contacted later when incorporating device 10 in an application, for calibration for example test tips or contact sockets (or other releasable contact means) may be used for contacting device 10 in order to apply a test current to conductor portion 11. Therefore, during such a calibration contacting of device 10 differs from the contacting in the later application, and such a calibration may only take into account a standardized test environment, but not the real environment where device 10 is used later. The real environment, i.e. conduction paths to and from conductor portion 11 in the actual implementation, influence the field distribution and therefore the measurement results. This influence of the environment in embodiments increases with decreasing length and increasing diameter or width of conductor portion 11, as then disturbing influences from the environment may be closer to conductor portion 11 in embodiments. On the other hand, it is desirable to decrease the length and increase the width or diameter of conductor portion 11 to decrease ohmic resistance and therefore heat dissipation. By using the correction by correction circuit 13 as explained above, in embodiments the influence of the environment may be at least partially compensated, and conductor portions having decreased length and/or increased width or diameter may be used compared to conventional solutions while still maintaining a required accuracy of a current sensing.

Figure 2:
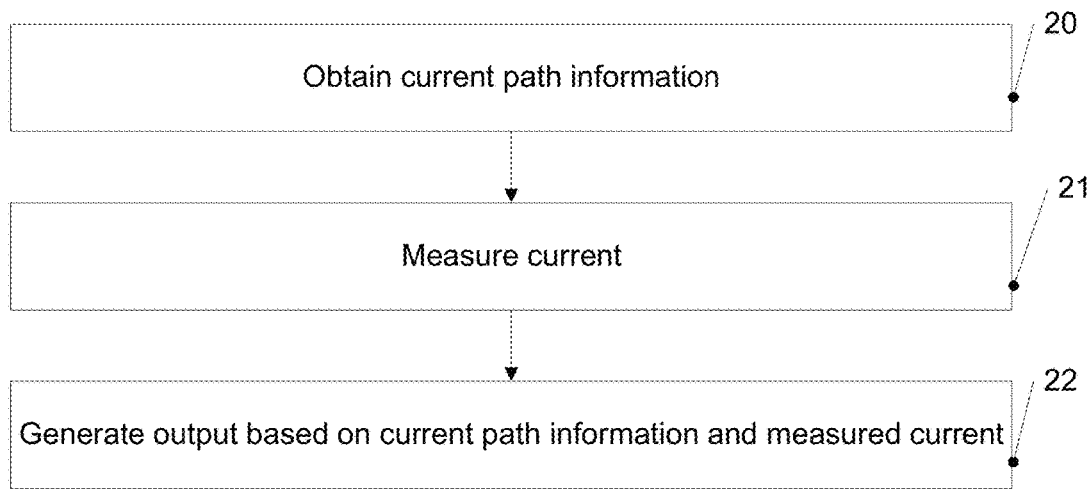
FIG. 2 is a flowchart illustrating a method according to an embodiment.

In FIG. 2, a flowchart illustrating a method according to an embodiment is shown. While the method will be described as a series of acts or events, it should be noted that the order in which the acts or events are described is not to be construed as limiting. In particular, in other embodiments other orders than the one shown and described may be used, and/or acts or events described may be performed parallel to each other, for example by different circuit paths of a circuit.

At 20, the method of FIG. 2 comprises obtaining information about a current path of a current to be measured. The information may for example comprise a direction of the current and/or an estimate of a magnitude of the current. In some embodiments, the current path information may be obtained by a source external to a current sensor device, for example controller 15 of FIG. 1. In other embodiments, obtaining the current path information may be performed within a current sensor device. For example, obtaining the current path information may comprise performing a preliminary current measurement, for example to obtain a polarity of the current to be measured and/or an estimate of the magnitude of the current.

At 21, the method comprises measuring the current, for example using a shunt-based current sensing element or a magnetic field based current sensing element.

At 22, the method comprises generating an output indicative of the current measured based on the current path information and the measured current. For example, in embodiments the current measured at 21 may be multiplied with a calibration factor depending on the current path information, or a correction value based on the current path information may be added to the measured current. Generally, the generation of the output may for example be performed as already discussed with reference to FIG. 1 above.

The method of FIG. 2 may be implemented using the current sensor device of FIG. 1, but may also be implemented using other devices. Modifications, variants and details applicable to current sensor device 10 in FIG. 1 may also be applicable to the method of FIG. 2 and vice versa.

Next, with reference to FIGS. 3-6 various implementation possibilities for current sensing elements usable in current sensor devices of embodiments as well as illustrative environments where current sensor devices according to embodiments may be used will be illustrated with reference to FIGS. 3-6.

Figure 3:
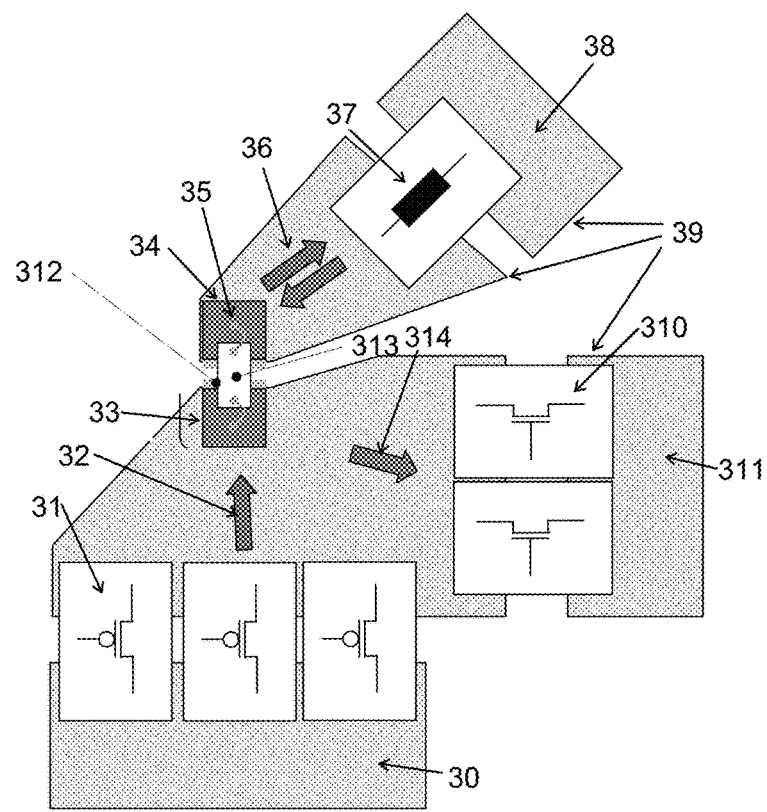
FIG. 3 is a diagram illustrating a configuration and environment of a current sensor device according to an embodiment.

In the embodiment of FIG. 3, a shunt current sensor device 312 is used arranged between two current contacts 33, 34 to sense a voltage between contacts 33, 34. Between contacts 33, 34 the current may flow via a restricted passage 313, which in the embodiment of FIG. 3 is arranged below current sensor device 312. Shunt current sensor device 312 may generally be implemented as discussed with reference to FIG. 1. Shunt current sensor device 312 in the example of FIG. 3 is arranged to sense a current flowing to or from a load 37, which is coupled between current sensor device 312 and a load ground 38. 35 denotes sense inputs of current sensor device 312. Elements denoted 39, for example load ground 38 or ground terminal of the half-bridge 311, may be so-called current traces on a printed circuit board (PCB) or some other kind of component board which holds the current sensor and/or power transistors and interconnect lines between them. The component board in embodiments may also serve the purpose of delivering dissipated heat, as it is for example the case in direct copper bond (DCB) substrates or insulated metal substrates (IMS).

The arrangement of FIG. 3 corresponds to a half-bridge configuration, where current may flow to load 37 via restricted passage 313 from a positive supply terminal 30 of the half-bridge configuration as indicated by an arrow 32. Current from positive supply terminal 30 to load 37 is switched via a number of high-side power transistors 31 in the embodiment of FIG. 3, three high-side power transistors 31 being shown in the Figure. However, any suitable number of power transistors may be used.

Current flowing from load 37 to restricted portion may ultimately flow to a ground terminal 311 of the half-bridge via one or more low-side power transistors 310, two of which are shown as an example. As indicated by an arrow 314, the current path in this direction differs from the current path indicated by arrow 32. Therefore, depending on switching states of power transistors 31 and power transistors 310, the current path differs, and the polarity differs. Therefore, in FIG. 3 the current may flow in different branches depending on a polarity, as illustrated by arrows 32, 314 in FIG. 3. Such different current paths may lead to different responses in a current-sensing element of current sensor device 12, i.e. different voltage drops between current contacts 33, 34, even if the magnitude of the current is the same. With the above-explained corrections depending on current path information, for example depending on a polarity, such differences may be taken into account in embodiments to improve the accuracy of the measurement.

High-side switches 31 and low-side switches 310 may for example be controlled by a controller like controller 15 of FIG. 1, and such a controller may then provide information regarding the current path (for example low-side or high-side) to a current sensor device.

Similar situations with different current paths may for example occur if a load is split in two parts, where one conducts currents in a first direction and the other conducts currents in an opposite direction, for example positive and negative currents. Such situations may for example occur if the load is a rectifier converting an alternating current or voltage into a direct current or voltage: In this case diodes or transistors connect a positive voltage to a positive terminal of a capacitor bank while other diodes or transistors connect a negative voltage to a negative terminal of a capacitor bank in some embodiments. Also in such a case, an output current flows through different paths depending on polarity.

The environment of FIG. 3 is an example where a geometry of external current connections like current rails connected to the current sensor device may influence the output of the current sensor, in particular for miniaturized current sensors with small dimensions and/or small restricted passages. In case of shunt-based current sensors like current sensor device 312, different current paths as shown may influence a potential distribution inside the shunt. In case of magnetic field sensors, also the current flowing through current paths external to the current sensor device generate magnetic fields, which in particular for small current sensor devices may significantly influence the measurement, as for smaller sensor devices these external current paths may be closer to a location where the sensing is performed.

Generally, in conventional solutions often a sensor is only calibrated with respect to the "internal" conductor, i.e. a conductor portion used for sensing which may be part of the current sensor device itself In embodiments, with the techniques described above also an influence of different external current paths, for example current paths not being arranged along a single line as shown in FIG. 3, may be taken into account.

Figure 4:
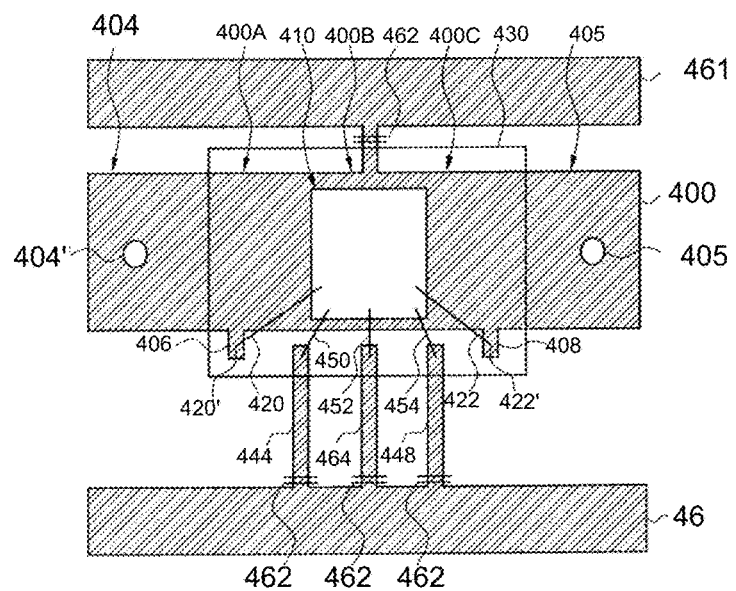
FIG. 4 illustrates a current sensor device according to an embodiment.

In FIG. 4, a plan view of a shunt element based current sensor device 410 according to an embodiment is shown, wherein 420', 422' correspond to current contacts, and bond wires 420 and 422 are current sense input supplying a voltage potential to a current sensor device 410. 444, 446 and 448 are further terminals of current sensor device 410 like supply voltage terminals or output terminals which are coupled to device 410 via bond wires 450, 452 and 454, respectively. 46 and 461 may be parts of a lead frame which are stamped off during manufacturing and not present in the final product. In the implementation example of FIG. 4, a portion 400 of a lead frame has areas 400A, 400, 400C and two attachment areas 404, 405 with respective attachments holes 404', 405' with which the current sensor device of FIG. 4 may be mounted to an apparatus where it is to be used. While not explicitly shown in FIG. 4, area 400 may have a restricted portion below current sensor device 410, similar to what is shown in FIG. 3. Current sensor device 410, which may be implemented as illustrated in FIG. 1, may be mounted to portion 400 with an electrically insulating adhesive. 462 denotes separation areas where lead frame portions 461, 46 may be separated from the remaining structure. The area surrounded by a box 430 may be encapsulated in a housing in some embodiments, including a part of portion 400, i.e. a part of the conductor.

The implementation of a current sensor together with lead frame elements shown in FIG. 4 is to be taken merely as an example, and other implementations may also be used. Furthermore, as already indicated instead of shunt-based current sensing elements also magnetic current sensing elements may be used, for example also in an environment as illustrated in FIG. 3.

Next, with reference to FIGS. 5 and 6 example for magnetic current sensor devices will be discussed.

Figure 5A:
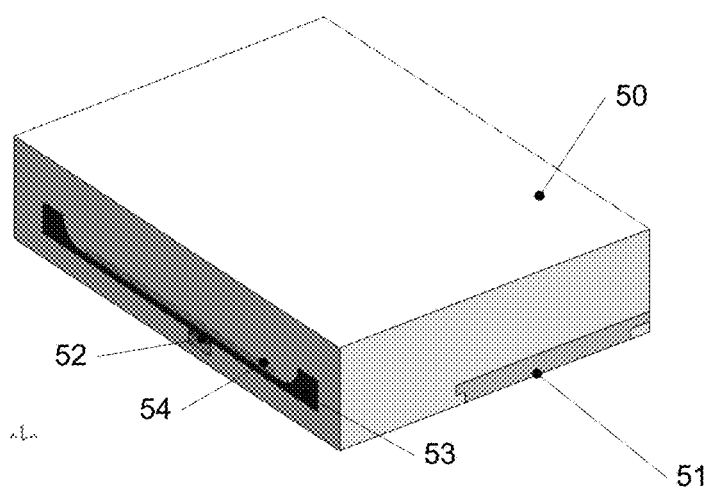
FIGS. 5A-5C show various schematic perspective views of a current sensor device according to an embodiment.
Figure 5B:
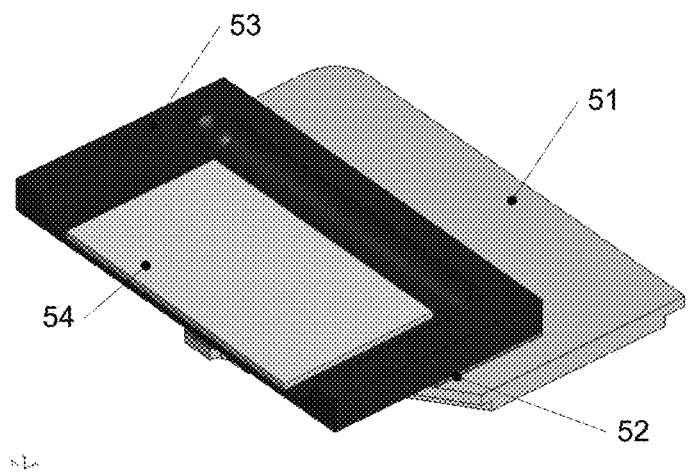
Figure 5C:
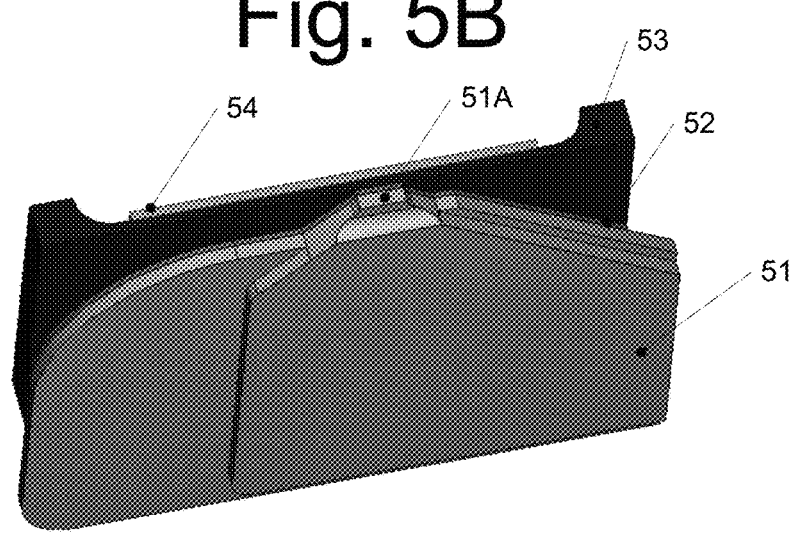

FIGS. 5A-5C show various perspective views of a magnetic current sensor device according to embodiments. FIGS. 5A-5C essentially show half of a magnetic current sensor, the other half would be mirror-symmetric with respect to a plane which for example corresponds to the plane where the elements 52, 53, 54 are visible in FIG. 5A.

FIG. 5A shows components 51-54 enclosed in a mold 50, while FIGS. 5B and 5C show perspective views without mold 50.

51 denotes a conductor, for example a lead frame or other kind of conductor, which has a constriction 51A serving as magnetic field generation portion, e.g. a conductor portion where a magnetic field to be sensed is generated. Providing the constriction may e.g. increase a current density. On conductor 51 in the embodiment of FIGS. 5A-5C a structured glass platelet 53 is mounted using an adhesive 52. On glass platelet 53, which for example provides electrical isolation, a silicon die 54 with components formed therein for implementing a current sensor device, for example the current sensor device illustrated with respect to FIG. 1, is provided. For example, functionalities for correcting a sensed current based on information regarding a current path may be implemented by corresponding circuitry in semiconductor die 54. Current sensing elements, for example magnetoresistive elements or Hall elements, may be formed in or on silicon die 54, e.g. on one or both sides of constriction 51A in case of Hall elements or directly above constriction 51A in case of magnetoresistive elements. Other implementations of current sensors and current sensing elements may also be used.

Figure 6:
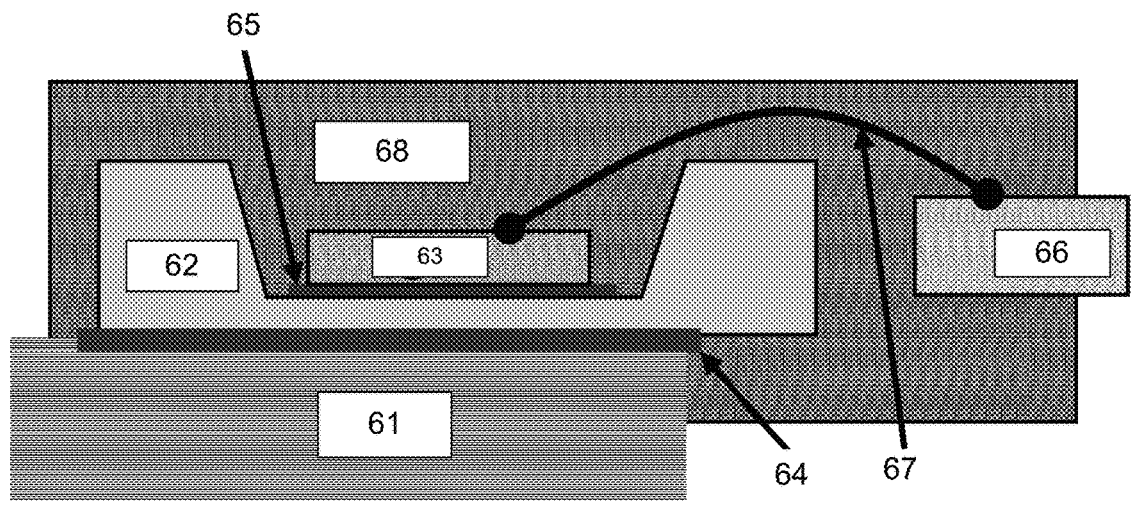
FIG. 6 shows a schematic cross-sectional view of a current sensor device according to an embodiment.

In FIG. 6, a cross-sectional view of a current sensor device according to an embodiment is shown. The current sensor device of FIG. 6 is somewhat similar to the current sensor device of FIG. 5 and may be an example for a cross-section thereof 61 denotes a conductor, like conductor 51 of FIGS. 5A-5C or any other conductor or conductive element. 62 in the embodiment of FIG. 6 is a structured glass platelet, similar to glass platelet 53 of FIG. 5, which is mounted to conductor 61 via an adhesive 64. It should be noted that glass platelet 62 or 53 is just one example of a galvanic isolation between a sensor chip and a conductor and numerous other kinds of isolation platelets (e.g. made of ceramic or cellulose), coatings (e.g. imides), layers (e.g. oxides or nitrides), foils (e.g. Kapton) could be used. Moreover the means for galvanic isolation may also be absent without significant effect in some embodiments. Furthermore, a semiconductor chip die 63 is mounted to structured glass platelet 62 using e.g. an adhesive 65. Semiconductor chip die 63 may for example implement functions as discussed above with reference to FIGS. 1 and 2. Furthermore, magnetic sensor elements like Hall sensors or magnetoresistive sensors may be formed in or on semiconductor chip die 63. Semiconductor chip die 63 is coupled to one or more terminals 66 via one or more bond wires 67. Terminals 66 may for example serve as output terminals for outputting a signal corresponding to the measured current, as supply terminals or as terminals to receive current path information as explained above. 68 designates a mold compound, like mold 50 of FIG. 5. Other implementations of magnetic field sensing based current sensor devices may also be used. It should be noted that while current sensors having an internal conductor formed associated therewith have been discussed above with respect to FIGS. 3-6, also current sensor devices without an own conductor, which may for example be mounted to a conductor, may be used in embodiments. A current path length through such an internal conductor may be 15 mm or less in some embodiments, although other values may be used as well.

Calibration factors, corrective values or similar values as mentioned above may be stored in a table. In some embodiments, such values may be programmable, for example to be stored in an erasable memory like an EEPROM memory, such that the calibration factors or correction values may be calibrated and determined for a sensor depending on its environment, for example by applying known test currents. Generally, embodiments of current sensor devices may be applicable in situations where currents may take different paths, which may be indicated by different polarities, different magnitudes or other properties of the currents which may be determined within the magnetic field sensor device, or information regarding the current path may be supplied externally, as explained above.

A correction applied to the measured signal as mentioned above may adjust the measured current for example by not more than 10% or not more than 5%. Current sensor devices according to embodiments may for example be adapted to measure currents of up to 20 A or more, although other values may also be used.

It is to be emphasized again that the above embodiments serve merely as examples, and techniques and concepts described herein may also be implemented in other manners than explicitly described, as evident to persons skilled in the art.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of embodiments.

Persons of ordinary skill in the relevant arts will recognize that embodiments may comprise fewer features than illustrated in any individual embodiment described above. The embodiments described herein are not meant to be an exhaustive presentation of the ways in which the various features may be combined. Accordingly, the embodiments are not mutually exclusive combinations of features; rather, embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

For purposes of interpreting the claims, it is expressly intended that the provisions of Section 112, sixth paragraph of 35 U.S.C. are not to be invoked unless the specific terms "means for" or "step for" are recited in a claim.

What is claimed is:

1. A current sensor device, comprising:
    a current sensing element adapted to sense a current in a conductor portion, and
    an output circuit adapted to output a signal indicative of the current in the conductor portion based on an output of the current sensing element and information regarding a current path outside of the conductor portion,
    wherein the output circuit is adapted to correct an output value of the current sensing element based on the information regarding the current path.

2. The device of claim 1, wherein the information regarding a current path comprises information regarding the polarity of the current.

3. The device of claim 1, wherein the information regarding the current path comprises information indicating an approximate magnitude of the current.

4. The current sensor device of claim 1, wherein the current sensor device comprises a memory to store information regarding an adjustment depending on the information.

5. The current sensor device of claim 1, wherein the output circuit is adapted to obtain the information regarding the current path based on a preliminary sensing of the current by the current sensing element, wherein the preliminary sensing is prior to actual sensing.

6. The current sensor device of claim 1, wherein the conductor portion is housed in a common package with at least one of the current sensing element or the output circuit.

7. The current sensor device of claim 1, wherein a length of a current path through the conductor portion is less than 50 mm.

8. The current sensor device of claim 1, wherein the current sensing element comprises a shunt-based current sensing element.

9. The current sensor device of claim 1, wherein the current sensing element comprises a magnetic field based current sensing element.

10. The device of claim 1, wherein the device is adapted to measure currents of up to at least 20 A.

11. A method, comprising:
    obtaining information regarding a current path,
    measuring, by a current sensing element, a current in a conductor portion, and
    generating, by a correction circuit, an output signal based on the information regarding the current path and the measured current,
    wherein generating the output signal comprises correcting the measured current based on the current path information and a path the current takes outside the conductor portion.

12. The method of claim 11, wherein obtaining the current path information comprises performing a preliminary measurement to obtain a polarity of the current.

13. The method of claim 11, wherein obtaining the current path information comprises performing a preliminary measurement to obtain an approximate magnitude of the current, wherein the preliminary measurement is prior to an actual measurement.

14. The method of claim 11, wherein correcting the measured current comprises correcting the measured current by less than 10% of the measured current.

15. The method of claim 11, further comprising calibrating the correction to account for an environment of the conductor portion.

16. The method of claim 11, wherein measuring the current comprises measuring a magnetic field caused by the current.

17. The method of claim 11, wherein measuring the current comprises measuring a voltage drop caused by the current.

* * * * *